(12) United States Patent
Tang et al.

(10) Patent No.: US 11,573,604 B2
(45) Date of Patent: Feb. 7, 2023

(54) POWER SUPPLY MODULE, FLEXIBLE DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guoqiang Tang, Beijing (CN); Kuo Sun, Beijing (CN); Yangpeng Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/620,012

(22) PCT Filed: Aug. 6, 2019

(86) PCT No.: PCT/CN2019/099462
§ 371 (c)(1),
(2) Date: Dec. 6, 2019

(87) PCT Pub. No.: WO2020/113986
PCT Pub. Date: Jun. 11, 2020

(65) Prior Publication Data
US 2021/0325928 A1 Oct. 21, 2021

(30) Foreign Application Priority Data
Dec. 4, 2018 (CN) .......................... 201811471960.0

(51) Int. Cl.
*G09F 9/30* (2006.01)
*G06F 1/16* (2006.01)
(Continued)

(52) U.S. Cl.
CPC ............ *G06F 1/1652* (2013.01); *G06F 1/188* (2013.01); *G06F 3/03545* (2013.01); *H01M 10/4207* (2013.01)

(58) Field of Classification Search
CPC .... H01M 6/40; H01M 10/04; H01M 10/0585; H01M 10/4207; H01M 10/0436;
(Continued)

(56) References Cited

U.S. PATENT DOCUMENTS 4,872,775 A * 10/1989 Chang .................... B43K 29/12
242/588
5,624,468 A 4/1997 Lake
(Continued)

FOREIGN PATENT DOCUMENTS

CN 102414900 A 4/2012
CN 103378337 A 10/2013
(Continued)

OTHER PUBLICATIONS

Office Action dated Oct. 26, 2020, issued in counterpart CN application No. 201811471960.0, with English translation. (30 pages).
(Continued)

*Primary Examiner* — Adrian S Wilson
*Assistant Examiner* — Gage Crum
(74) *Attorney, Agent, or Firm* — WHDA, LLP

(57) ABSTRACT

The disclosure relates to a power supply module. The power supply module may include a flexible substrate and a plurality of battery cells distributed in an array on one side of the flexible substrate. Adjacent battery cells of the plurality of battery cells on each line in a first direction may be connected in series by a flexible connector to form a plurality of lines of battery cells, and the plurality of lines of battery cells may be connected in parallel through a first electrode.

10 Claims, 7 Drawing Sheets

(51) Int. Cl.
  *G06F 1/18* (2006.01)
  *G06F 3/0354* (2013.01)
  *H01M 10/42* (2006.01)

(58) Field of Classification Search
  CPC ........... H01M 2220/30; H01L 51/0097; H01L 27/3267; H01L 2252/5338; H02J 50/005; H02J 50/12; H02J 50/402; H04M 1/0268; H04M 1/72403; H04M 10/04; H04M 2250/16; G02F 1/133305; G06F 1/1652; G06F 3/03545; G06F 1/1654; G09F 9/301; G09F 2203/04102; G09G 2380/02; G09G 3/035; Y02E 60/10; B43K 29/00
  See application file for complete search history.

(56) References Cited

U.S. PATENT DOCUMENTS

| | | | |
|---|---|---|---|
| 2003/0109286 A1* | 6/2003 | Hack | H04M 1/0285 455/566 |
| 2005/0079418 A1 | 4/2005 | Kelley et al. | |
| 2006/0222442 A1* | 10/2006 | Lin | B43K 29/12 401/195 |
| 2009/0080965 A1* | 3/2009 | Adamberry | B43K 31/00 401/195 |
| 2010/0222110 A1* | 9/2010 | Kim | G06F 3/04883 345/173 |
| 2010/0261049 A1 | 10/2010 | Kwak et al. | |
| 2012/0268838 A1* | 10/2012 | Rittenburg | A45C 15/00 359/802 |
| 2013/0273405 A1* | 10/2013 | Takahashi | H01M 10/0436 429/127 |
| 2015/0333360 A1 | 11/2015 | Tajima et al. | |
| 2016/0099454 A1 | 4/2016 | Kwon et al. | |
| 2017/0108952 A1* | 4/2017 | Tang | H04M 1/0285 455/566 |
| 2017/0329368 A1* | 11/2017 | Rho | H04M 1/0262 |
| 2018/0188830 A1* | 7/2018 | Kim | G06F 1/1626 |
| 2019/0363399 A1* | 11/2019 | Yoshioka | H01M 10/0525 |
| 2020/0126457 A1* | 4/2020 | Wang | G09F 9/301 |
| 2020/0274393 A1* | 8/2020 | Kang | G06F 1/1656 |

FOREIGN PATENT DOCUMENTS

| | | | |
|---|---|---|---|
| CN | 105098249 A | | 11/2015 |
| CN | 107612059 A | | 1/2018 |
| CN | 207117695 U | * | 3/2018 |
| CN | 207117695 U | | 3/2018 |
| CN | 207217642 U | | 4/2018 |
| CN | 108155332 A | | 6/2018 |
| CN | 108320669 A | * | 7/2018 |
| CN | 108320669 A | | 7/2018 |
| CN | 108461801 A | | 8/2018 |
| CN | 108683269 A | | 10/2018 |

OTHER PUBLICATIONS

International Search Report dated Sep. 27, 2019, issued in counterpart application No. PCT/CN2019/099462. (11 pages).

* cited by examiner

POWER SUPPLY MODULE, FLEXIBLE DISPLAY PANEL AND DISPLAY APPARATUS

CROSS-REFERENCE TO RELATED APPLICATIONS

This application claims benefit of the filing date of Chinese Patent Application No. 201811471960.0 filed on Dec. 4, 2018, the disclosure of which is hereby incorporated in its entirety by reference.

TECHNICAL FIELD

The present disclosure relates to display technologies, and in particular to a power supply module, a flexible display panel, and a display apparatus.

BACKGROUND

A flexible screen is one which is bendable. However, the rigid nature of the motherboard and battery limits the flexing of the flexible screen on the display device, which can only be bent in the edge region. In addition, the thin and light features of the flexible screen cannot be fully obtained.

BRIEF SUMMARY

One embodiment of the present disclosure is a power supply module. The power supply module may include a flexible substrate and a plurality of battery cells distributed in an array on one side of the flexible substrate. Adjacent battery cells of the plurality of battery cells on each line in a first direction may be connected in series by a flexible connector to form a plurality of lines of battery cells, and the plurality of lines of battery cells may be connected in parallel through a first electrode.

Optionally, the power supply module further comprises a first power interface at an edge of the flexible substrate, wherein the first power interface is connected to the plurality of battery cells, and is configured to electrically connect the plurality of battery cells to a second electrode of a flexible display screen for supplying power to the flexible display screen.

Optionally, the power supply module further comprises a second power interface at an edge of the flexible substrate, wherein the second power interface is connected to the plurality of battery cells, and the second power interface is configured as an interface for charging the plurality of battery cells.

Optionally, the power supply module further comprises a flexible packaging film layer, wherein the flexible packaging film layer is configured to cover and encapsulate the plurality of battery cells.

Optionally, the first direction is a row direction, a column direction or a diagonal direction.

Optionally, the flexible connector is composed of an insulating material.

Optionally, the first electrode comprises a plurality of first stripe structures extending in the first direction and a second stripe structure connecting the plurality of first stripe structures in parallel; and each of the plurality of first stripe structures is respectively electrically connect the battery cells on a line in the first direction in series.

Optionally, the first power interface and the second power interface each electrically connect to the second stripe structure.

One embodiment of the present disclosure provides a flexible display panel, comprising a flexible display screen and the power supply module according to one embodiment of the present disclosure.

Optionally, the flexible display panel further comprises a wireless signal receiver on a non-display area of the flexible display screen, wherein the signal receiver is configured to receive image signals for display.

Optionally, the flexible display panel further comprises a plurality of first charging coils connected in series or parallel on the flexible display screen, a bonding disk connected to the plurality of first charging coils, wherein the bonding disk is capable of being connected to the first electrode on the flexible substrate to wirelessly charge the plurality of battery cells.

Optionally, the flexible display panel further comprises a power switch on the non-display area of the flexible display screen, wherein the power switch is configured to control operational states of the flexible display screen.

One embodiment of the present disclosure is a display apparatus, comprising the flexible display panel according to one embodiment of the present disclosure.

Optionally, the display apparatus further comprises a mobile terminal, and the mobile terminal comprises a slot configured to allow the flexible display panel after being rolled into a cylindrical shape to be inserted into.

Optionally, the mobile terminal comprises a wireless signal transmitter for outputting image signals.

Optionally, the display apparatus further comprises a second charging coil in the slot, wherein the second charging coil is configured to cooperate with the first charging coils to charge the plurality of battery cells when the flexible display panel is inserted into the slot.

Optionally, the display apparatus further comprises a power supply interface in the slot, wherein the power supply interface is connected to a power supply unit of the mobile terminal, and configured to connect to the second power interface of the power supply module once inserted in the slot for charging the plurality of battery cells.

Optionally, the mobile terminal comprises a stylus pen, the slot is for the stylus to be inserted into, and the flexible display panel is capable of being wrapped around the stylus pen to be inserted into the slot.

Optionally, the stylus pen is hollow and an outer surface of the stylus pen is provided with an opening for inserting a first end of the flexible display panel, the first end of the flexible display panel is provided with a rotating shaft in parallel with a surface of the flexible display screen, one end of the rotating shaft is provided with a rotating portion for rotating the rotating shaft, and when the rotating shaft is inserted into the opening, the rotating portion is exposed outside the stylus pen.

Optionally, the flexible display panel comprises a second end opposite to the first end of the flexible display panel, and the second end is provided with a protrusion for snapping into the opening, the protrusion is configured for pulling the flexible display panel out of the stylus pen.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
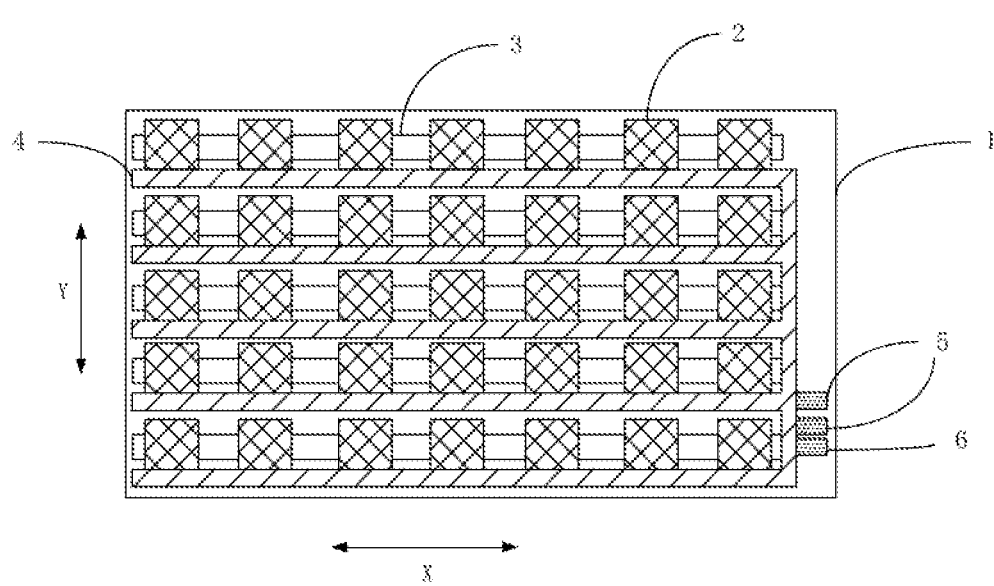
FIG. 1 is a schematic diagram of a flexible substrate according to some embodiments of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-8. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left." "right," etc. are only used to indicate the relative positional relationship. When the absolute position of the object being described is changed, the relative positional relationship may also change accordingly.

In the description of the following embodiments, specific features, structures, materials or characteristics may be combined in any suitable manner in any one or more embodiments or examples.

The following terms, used in the present description and the appended claims, have the following definitions.

The term "flexible" herein means that the feature defined by the flexible can be defined as largely able to bend without breaking.

Figure 2:
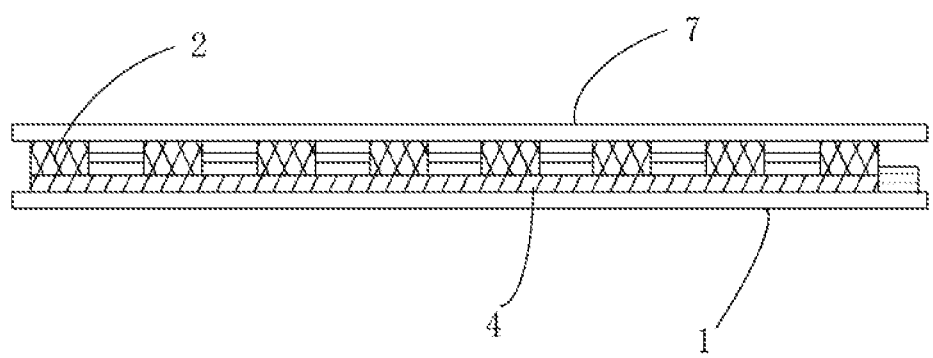
FIG. 2 is a side view of the flexible substrate in the X direction in FIG. 1.
Figure 3:
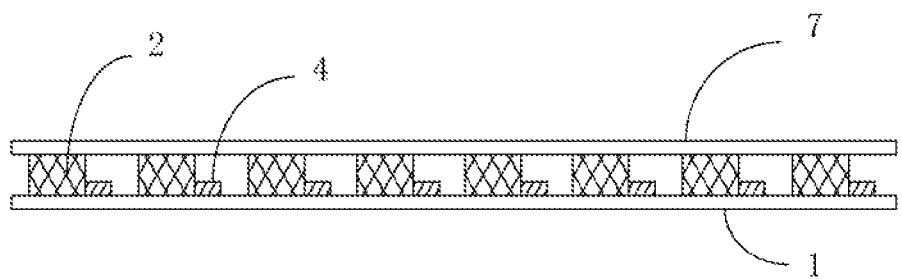
FIG. 3 is a side view of the flexible substrate in the Y direction in FIG. 1.

As shown in FIGS. 1-3, one embodiment of the present disclosure provides a power supply module, including a flexible substrate 1. A plurality of battery cells 2 is disposed in an array on one side of the flexible substrate 1. Adjacent battery cells of the plurality of battery cells 2 on each line in a first direction are connected in series by a flexible connector 3. The plurality of lines of adjacent battery cells connected in series in the first direction are connected in parallel.

The array arrangement of the plurality of battery cells 2 transform the concept of traditional single battery into a plurality of battery cells to achieve the flexibility and bendability of the battery as well as the power supply module. The flexible power supply module supplies power to a flexible display screen. The combination of the flexible display screen and the flexible power supply module may resolve the limitation on the bendability of the flexible display screen caused by the battery. As such, the flexible display screen can possess lightweight and flexible properties as a sheet of newspaper, thereby realizing the advantages of flexible display and enhancing the value of the screen itself.

The first direction may vary. In one embodiment, the first direction may be a row direction, a column direction or a diagonal direction. The first direction of the battery cells in FIG. 1 is the row direction (X), but it is not limited thereto.

In one embodiment, a first power interface 5 is disposed on an edge of the flexible substrate 1. The first power interface 5 is connected to the plurality of the battery cells 2. The plurality of battery cells 2 are electrically connected to a second electrode of the flexible display screen through the first power interface 5 for supplying power to the flexible display screen.

In one embodiment, a second power interface 6 is disposed on the edge of the flexible substrate 1. The second power interface 6 is connected to the plurality of the battery cells 2. The second power interface 6 is used for charging the plurality of the battery cells.

The plurality of battery cells 2 can be charged in various manners including wired or wireless charging. The specific structure of the second power interface 6 may be set according to actual needs.

In one embodiment, as shown in FIG. 1, adjacent battery cells of the plurality of battery cells 2 in each row are connected in series, and the multiple rows of the battery cells are connected in parallel. Each of the plurality of battery cells 2 has a basic structure of a lithium battery, that is, composed of an anode, an electrolyte, a membrane, and a cathode. The composition of the anode may vary. For example, the anode may be composed of a combination of Cu (copper) and graphene layers. The graphene layer may include graphene only or a mixture of graphene, carbon black, polyvinylidene fluoride (PVDF) polymer and so on at certain ratios. A flexible connector 3 is disposed among the plurality of battery cells 2 in each row to form a chain of the battery cells, thereby allowing the chain of the battery cells to bend in the X direction. The bending radius may be less than 1 mm. The plurality of rows of the battery cells are spaced apart so that the flexible substrate 1 having the battery cells 2 can be bent in the Y direction. Furthermore, the arrangement of the flexible connector can realize the distortion of the battery cells 2. During the deformation process, the charge and discharge performance and energy density of the battery cells 2 can still be maintained at an extremely high level.

In the embodiment, the arrangement of the plurality of the battery cells 2 may reduce the weight of the flexible display screen comparing to the conventional lithium ion battery, thereby making the screen lighter, similar to an electronic paper.

The flexible connector 3 may be made from a variety of materials. The flexible connector 3 may be made of a conductive flexible material or an insulating flexible material.

In one embodiment, the flexible connector is not electrically conductive. The series and parallel connections of the plurality of battery cells 2 may be realized by the first electrodes 4 on the flexible substrate 1.

The arrangement of the first electrodes 4 and the connection manner of the first electrodes 4 with the plurality of battery cells 2 may vary, provided the battery cells are connected in series or in parallel. In one embodiment, the first electrode 4 includes a plurality of first stripe structures extending in the first direction, and a second stripe structure connecting the plurality of first stripe structures in parallel. Each of the plurality of first stripe structures connects the plurality of battery cells disposed along the first direction to one another.

In one embodiment, the edge of the flexible substrate is provided with a first power interface 5 connected to the plurality of battery cells 2. The first power interface 5 is used to supply power to the flexible display screen. The first power interface 5 is electrically connected to the second stripe structure. In one embodiment, the edge of the flexible substrate is provided with a second power interface 6 connected to the plurality of battery cells 2, and the second power interface 6 is used to charge the plurality of the battery cells 2. The second power interface 6 is electrically connected to the second stripe structure. In some embodiments, as shown in FIGS. 2 and 3, the power supply module further comprises a flexible packaging film layer 7. The flexible packaging film layer 7 covers the surfaces of the plurality of the battery cells 2 to package or encapsulate the plurality of the battery cells 2.

The flexible packaging film layer 7 may be configured to protect the battery cells as being waterproof and oxygen-proof.

The flexible packaging film layer 7 shown in FIG. 2 and FIG. 3 is only a schematic demonstration. In one embodiment, the flexible packaging film layer 7 is a thin layer, approximately with a thickness in a range of about 1 μm to about 10 μm. The embodiment does not limit thereto. The flexible packaging film layer 7 is attached to surfaces of the plurality of the battery cells, and is in contact with a region of the flexible substrate 1 where the plurality of the battery cells 2 are not disposed to, thereby forming a package for the plurality of the battery cells 2.

One embodiment of the present disclosure further provides a flexible display panel comprising a flexible display screen 8 and the power supply module according to one embodiment of the present disclosure to supply power to the flexible display screen.

Figure 4:
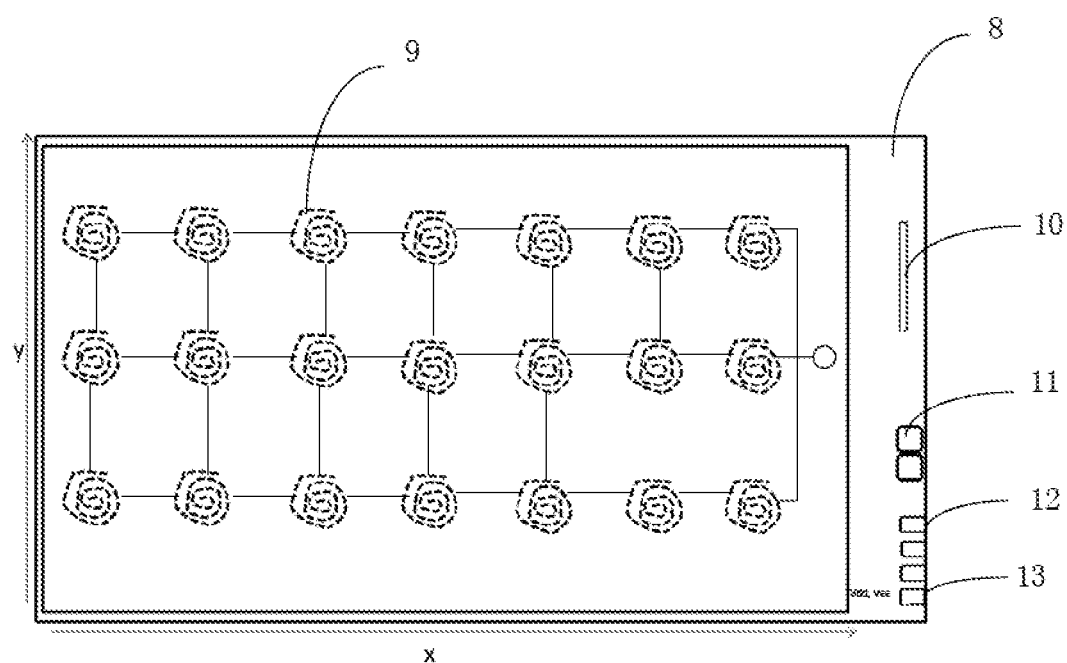
FIG. 4 is a schematic diagram of a flexible display screen according to some embodiments of the present disclosure.

In one embodiment as shown in FIG. 4, a wireless signal receiver 10 is disposed in a non-display region of the flexible display screen 8 to receive image signals so that the flexible display screen can display.

The location of the wireless signal receiver 10 can be set according to the actual situation. In one embodiment, the wireless signal receiver 10 is placed on one side of the flexible display screen 8, but is not limited thereto.

In one embodiment, the wireless signal receiver IC 10 can wirelessly receive image signals by means of wireless reception for realizing the display of the flexible display screen 8, so that the flexible display screen 8 can be separated from the motherboard, thereby exhibiting the flexibility feature of the flexible display screen 8. In one embodiment, there are two first power interfaces 5. A side of the flexible display screen 8 is provided with a third electrode 12 and a second electrode 13, which are respectively connected to the two first power interfaces 5. A plurality of the battery cells 2 supply power to the wireless signal receiver IC 10 through the third electrode 12, and the plurality of battery cells 2 supply power to the flexible display screen 8 through the second electrode 13.

In one embodiment, a plurality of first charging coils 9 connected in series or in parallel is disposed on the flexible display screen 8. The edge of the flexible substrate 1 is provided with a second power interface 6 connected to the plurality of battery cells 2. The flexible display screen 8 is provided with a bonding disk connected to the first charging coil 9. The bonding disk can be coupled to the first electrodes 4 on the flexible substrate to wirelessly charge the plurality of the battery cells 2.

The plurality of first charging coils 9 may be configured to charge the battery cells wirelessly, provided that the flexible display panel is placed on a compatible charging device.

In one embodiment, a power switch 11 for controlling operational state of the flexible display screen 8 may be disposed in the non-display area of the flexible display screen 8.

The position of the power switch 11 may be set according to actual situation. In one embodiment, the power switch 11 is located on the side of the flexible display screen 8, but is not limited thereto.

Figure 5:
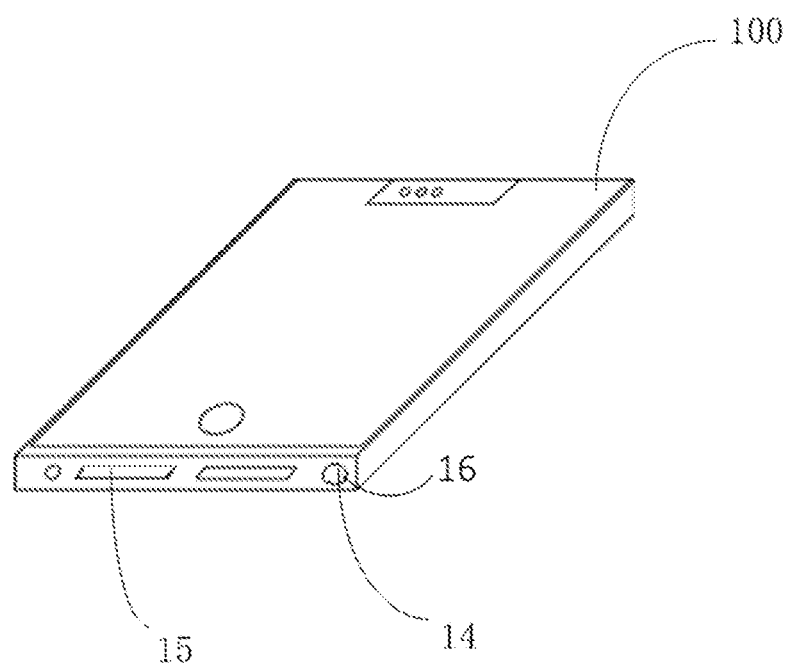
FIG. 5 is a schematic diagram of a mobile terminal according to some embodiments of the present disclosure.

During the operational state, the power switch 11 is turned on, so that the flexible display screen 8 is in the operational state to display the screen normally. During the non-operational state, the power switch 11 is turned off so that the power supply to the flexible display screen 8 is stopped. As such, the flexible display screen 8 appears black, thereby saving power and reducing energy loss. One embodiment of the present disclosure further provides a display apparatus comprising a mobile terminal 100 and the flexible display panel according to one embodiment of the present disclosure. The flexible display panel may be rolled into a cylindrical shape and then inserted into a slot 14 of the mobile terminal 100 as shown in FIG. 5.

The flexible display panel of the present embodiment is combined with the mobile terminal 100 to switch between the display states of the mobile terminal 100 and the flexible display panel. When the mobile terminal 100 is used, the flexible display panel can be rolled into a cylinder shape to be inserted into the slot 14 for easy carrying. When a large-sized flexible screen display is required, the flexible display panel can be pulled out from the slot 14 and opened up. In one embodiment, the mobile terminal 100 is provided with a wireless signal transmitter IC 15 (integrated circuit) for outputting image signals. A side of the flexible display screen 8 is provided with a wireless signal receiver IC 10 that receives the image signals for display by the flexible display screen 8.

In one embodiment, the wireless signal transmitter IC 15 of the mobile terminal 100 and the wireless signal receiver IC 10 of the flexible display screen 8 are connected by a data transmission protocol, so that the mobile terminal 100 can be separated from the flexible display panel for convenient use.

When not in use, the flexible display panel may be inserted into the slot 14 of the mobile terminal 100. The motherboard of the mobile terminal 100 acts with the IC to control the display on the mobile terminal. When the flexible display 8 is used, the wireless signal transmitter IC 15 on the mobile terminal 100 is connected to the wireless signal receiver IC 10 on the flexible display screen 8 via a data transmission protocol, and transmits the video or image signals to the flexible display screen 8 for display. At this time, the mobile terminal 100 may be a computer host or a projector, and the flexible display screen 8 in the flexible display panel may be used as a screen or a projector screen. In one embodiment, the flexible display panel is a portable, lightweight display device. The power consumed by the large-sized screen can be directly obtained from a plurality of the battery units 2, thereby increasing the usage time of the mobile terminal 100.

The display apparatus in the present disclosure may be used in a variety of applications. For example, the flexible display panel may be attached on a windshield so as to provide a comfortable navigation experience to a driver.

The flexible display panel can also be used for PPT display. That is, the flexible display panel can be pulled out of the slot 14 of the mobile terminal 100 to display the PPT content on the flexible display screen 8 for the conference. The flexible display panel may also be used as a movable map. When climbing or hiking, the terminal 100 can be installed in the bag, and only a ultra-light and ultra-thin flexible display panel according to one embodiment of the present disclosure needs to be held in hand, thereby reducing the probability of breaking the mobile terminal 100. Furthermore, the moving is more comfortable.

The plurality of battery cells 2 may be charged in various manners. The charging may be in a wireless or wired mode. Charging may be performed by a specific charging device or by the mobile terminal 100.

In one embodiment, the flexible display screen 8 is provided with a plurality of first charging coils 9 connected in series or parallel. Provided in the slot 14 is a second charging coil 16 that cooperates with the first charging coils 9 to charge the plurality of the battery cells 2 when the flexible display panel is inserted into the slot 14. Because the first charging coils 9 and the second charging coil 16 cooperate to charge the plurality of the battery units 2, the setting position of the second charging coil is relatively flexible, thereby reducing the process difficulty. However, the arrangement of the second charging coil enables the mobile terminal 100 to integrate a wireless charging device, and the wireless charging device correspondingly occupies a certain space.

In the second embodiment of the present embodiment, the edge of the flexible substrate 1 is provided with a second power interface 6 connected to the plurality of battery cells 2, and the slot 14 is provided with the mobile terminal 100. A power supply interface connected to the power supply unit of the mobile terminal 100 is disposed in the slot 14, and the power supply interface may be connected to the second power interface 6 to charge the plurality of the battery units 2.

In this embodiment, only a power supply interface connected to the power supply unit of the mobile terminal 100 is added to the original structure of the mobile terminal 100. When the flexible display panel is inserted into the slot 14, the power supply interface is connected to the second power interface 6, and the plurality of battery units 2 are charged by the power supply unit of the mobile terminal 100. If the use environment is convenient, the display module can be charged by a matching charging device. If in a use environment that the charging device is not available, the power of the mobile terminal 100 can be used for charging.

The charging method in the second embodiment of the present embodiment is easier to use than the charging method in the first embodiment of the present disclosure, and the process difficulty is low.

Figure 6:
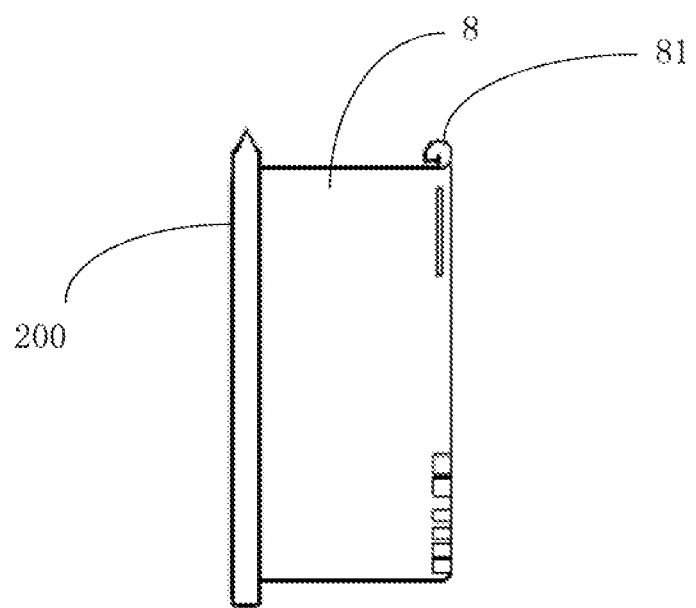
FIG. 6 is a schematic diagram of a flexible display screen partially rolled around a stylus according to some embodiments of the present disclosure.

In one embodiment, the mobile terminal 100 includes a stylus pen 200, and the slot 14 is a slot 14 for the stylus pen 200 to be inserted into. The flexible display panel can be wrapped around the stylus pen 200 to be inserted into the slot 14. FIG. 6 is a schematic diagram of the flexible display panel partially wrapped around the stylus pen 200.

On the mobile terminal 100 having the stylus pen 200, the structure of the mobile terminal 100 is utilized to combine with the flexible display panel, thereby reducing the cost.

Figure 7:
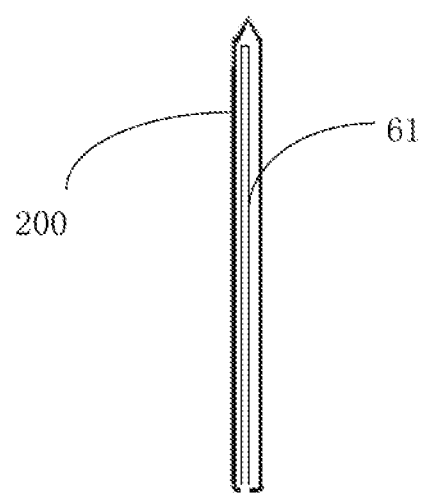
FIG. 7 is a schematic diagram of a stylus according to some embodiments of the present disclosure.
Figure 8:
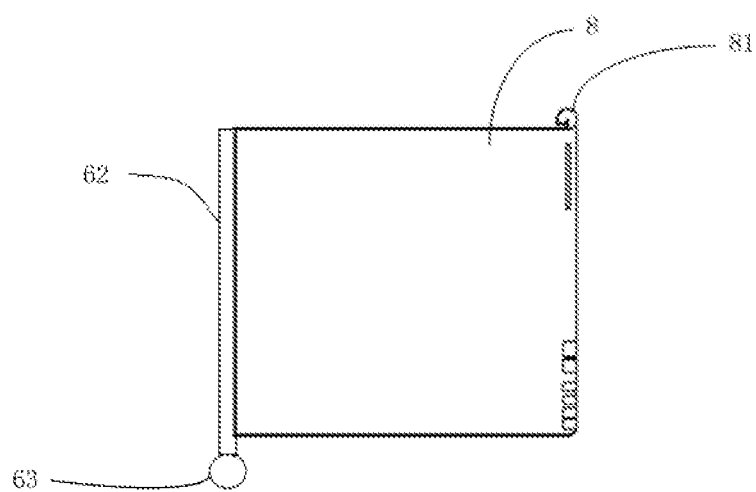
FIG. 8 is a schematic diagram of a flexible display panel according to some embodiments of the present disclosure.

The connection relationship between the stylus pen 200 and the flexible display panel may be various. In one embodiment, as shown in FIGS. 6-8, in order to facilitate the winding and pulling of the flexible display panel, the stylus pen 200 is a hollow structure, and an outer surface of the stylus pen 200 is provided with an opening 61 for inserting a first end of the flexible display panel. The first end of the flexible display panel is provided with a rotating shaft 62 in parallel with a surface of the flexible display screen 8. One end of the rotating shaft 62 is provided with a rotating portion 63 for rotating the rotating shaft 62. When the rotating shaft is inserted into the opening 61, the rotating portion 63 is exposed outside the stylus pen 200.

The specific structure of the rotating portion 63 may be various. The rotation of the rotating shaft 62 may be automatic or manual. For example, the rotating portion may be a rotating head connected to one end of the rotating shaft 62. As shown in FIG. 8, the rotating shaft 62 may be manually rotated by the rotating head. The rotating portion 63 may also include a rotating electrical machine, a transmission member that connects the rotating shaft 62 to the rotating electrical machine, and a switch for controlling the operating state of the rotating electrical machine.

Further, the flexible display panel includes a second end disposed opposite to the first end, and the second end is provided with a protrusion 81 for snapping into the opening 61. The protrusion 81 can also be used to pull out the flexible display panel from the stylus 200.

Of course, other structures may be employed in order to facilitate the pulling out of the flexible display panel from the slot 14.

In one embodiment, the rotating shaft 62 is inserted into the opening 61, and then the rotating shaft 62 is rotated by the rotating portion 63, thereby winding the flexible display panel on the stylus pen 200. The arrangement of the rotating shaft 62 and the stylus pen 200 is such that the flexible display panel after being wound is accommodated in the stylus pen 200, and the space occupied by the wound flexible display panel is limited, thereby facilitating the flexible display panel after winding being inserted into the slot 14.

When the flexible display panel needs to be pulled out, the flexible display panel can be easily pulled out by the protrusion 81, which is convenient and quick.

It should be noted that the mobile terminal 100 may be a mobile phone, a Pad, or the like.

While the embodiments of the present disclosure have been described above, the described embodiments are merely provided for the purpose of understanding the disclosure and are not intended to limit the disclosure. Any modification and variation in the form and details of the embodiments may be made by those skilled in the art without departing from the spirit and scope of the disclosure.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed:

1. A display apparatus, comprising a flexible display panel and a mobile terminal,
wherein the flexible display panel includes a flexible display screen and a power supply module;
the power supply module includes a flexible substrate and a plurality of battery cells distributed in an array on one side of the flexible substrate, adjacent battery cells of the plurality of battery cells on each line in a first direction are connected in series by a flexible connector to form a plurality of lines of battery cells, and the plurality of lines of battery cells are connected in parallel through a first electrode;
the flexible display panel includes a first end and a second end, the first end is located at a side of the flexible display panel, and the second end is located at an opposite side of the flexible display panel;
the first end is provided with a rotating shaft in parallel with a surface of the flexible display screen and one end of the rotating shaft is provided with a rotating portion for rotating the rotating shaft;
the mobile terminal includes a slot and a stylus pen, the slot is configured to allow the stylus pen to be inserted into and the flexible display panel is capable of being wrapped around the stylus pen to be inserted into the slot, the rotating shaft is attached to the flexible display panel, the flexible display panel includes the rotating shaft and the rotating portion, the rotating shaft and the rotating portion are not attached to the stylus pen, and the rotating shaft and the rotating portion are configured to allow the flexible display panel attached with the rotating shaft and the rotating portion to be separated with the stylus pen in use;
the stylus pen is hollow, an outer surface of the stylus pen is provided with an opening, the opening is open at a side of the stylus pen till one end of the stylus pen, the opening is configured to allow the first end of the flexible display panel to be slid into the stylus pen with the rotating portion exposed outside the stylus pen to rewind the flexible display panel into the stylus pen, and the opening is also configured to allow the flexible display panel to be pulled out of the stylus pen in use; and
the flexible display panel further includes a plurality of first charging coils connected in series or parallel on the flexible display screen, the mobile terminal further comprises a second charging coil in the slot, and the second charging coil is configured to cooperate with the first charging coils to charge the plurality of battery cells when the flexible display panel is inserted into the slot.

2. The display apparatus according to claim 1, wherein the flexible display panel further includes a wireless signal receiver on a non-display area of the flexible display screen and the wireless signal receiver is configured to receive image signals for display.

3. The display apparatus according to claim 1, wherein the flexible display panel further includes a power switch on the non-display area of the flexible display screen and the power switch is configured to control operational states of the flexible display screen.

4. The display apparatus according to claim 1, wherein the mobile terminal comprises a wireless signal transmitter for outputting image signals.

5. The display apparatus according to claim 1, wherein the second end is provided with a protrusion for snapping into the opening and the protrusion is configured for pulling the flexible display panel out of the stylus pen.

6. The display apparatus according to claim 1, wherein the power supply module includes a first power interface at an edge of the flexible substrate and the first power interface is connected to the plurality of battery cells and is configured to electrically connect the plurality of battery cells to a second electrode of the flexible display screen for supplying power to the flexible display screen.

7. The display apparatus according to claim 6, wherein the power supply module includes a second power interface at an edge of the flexible substrate, the second power interface is connected to the plurality of battery cells, and the second power interface is configured as an interface for charging the plurality of battery cells.

8. The display apparatus according to claim 1, wherein the power supply module includes a flexible packaging film layer, and the flexible packaging film layer is configured to cover and encapsulate the plurality of battery cells.

9. The display apparatus according to claim 1, wherein the first direction is a row direction, a column direction or a diagonal direction.

10. The display apparatus according to claim 1, wherein the flexible connector is composed of an insulating material.

* * * * *